(12) United States Patent
Chong et al.

(10) Patent No.: US 10,103,139 B2
(45) Date of Patent: Oct. 16, 2018

(54) METHOD AND DESIGN OF LOW SHEET RESISTANCE MEOL RESISTORS

(71) Applicant: Xilinx, Inc., San Jose, CA (US)

(72) Inventors: Nui Chong, Cupertino, CA (US); Jae-Gyung Ahn, Pleasanton, CA (US); Ping-Chin Yeh, San Jose, CA (US); Cheang-Whang Chang, Mountain View, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/792,847

(22) Filed: Jul. 7, 2015

(65) Prior Publication Data

US 2017/0012041 A1    Jan. 12, 2017

(51) Int. Cl.
| | |
|---|---|
| *H01L 29/00* | (2006.01) |
| *H01L 23/62* | (2006.01) |
| *H01L 27/07* | (2006.01) |
| *H01L 23/522* | (2006.01) |
| *H01L 27/06* | (2006.01) |
| *H01L 49/02* | (2006.01) |
| *H01L 21/283* | (2006.01) |
| *H01L 21/76* | (2006.01) |
| *H01L 27/02* | (2006.01) |

(52) U.S. Cl.
CPC ........ *H01L 27/0738* (2013.01); *H01L 21/283* (2013.01); *H01L 21/76* (2013.01); *H01L 23/5228* (2013.01); *H01L 27/0629* (2013.01); *H01L 28/24* (2013.01); *H01L 27/0207* (2013.01)

(58) Field of Classification Search
CPC ..... H01L 27/0738; H01L 28/24; H01L 21/76; H01L 21/283; H01L 27/0207; H01L 28/22; H01L 27/0288; H01L 27/0266; H01L 27/0629; H01L 27/0635; H01L 27/0711; H01L 28/20; H01L 27/075; H01L 27/0783
USPC ....... 257/537, 350, 351, 358, 360, 379, 516, 257/577
See application file for complete search history.

(56) References Cited

U.S. PATENT DOCUMENTS

| | | | |
|---|---|---|---|
| 2008/0160686 A1 | 7/2008 | Nakamatsu et al. | |
| 2010/0073122 A1* | 3/2010 | Le Neel | H01C 17/265 338/25 |
| 2011/0057267 A1 | 3/2011 | Chuang et al. | |
| 2012/0299115 A1* | 11/2012 | Chuang | H01L 21/31055 257/379 |
| 2013/0093052 A1 | 4/2013 | Ma et al. | |
| 2013/0320497 A1* | 12/2013 | Zhang | H01L 27/101 257/538 |
| 2014/0210014 A1 | 7/2014 | Ma et al. | |

(Continued)

FOREIGN PATENT DOCUMENTS

WO    2014041950    3/2014

*Primary Examiner* — Kimberly Rizkallah
*Assistant Examiner* — Dilinh Nguyen
(74) *Attorney, Agent, or Firm* — Gerald Chan; Carleton Clauss

(57) ABSTRACT

An integrated circuit structure includes: a semiconductor substrate; a shallow trench isolation (STI) region in the semiconductor substrate; one or more active devices formed on the semiconductor substrate; and a resistor array having a plurality of resistors disposed above the STI region; wherein the resistor array comprises a portion of one or more interconnect contact layers that are for interconnection to the one or more active devices.

15 Claims, 20 Drawing Sheets

(56) References Cited

U.S. PATENT DOCUMENTS

2014/0369099 A1* 12/2014 Asako ................... H02M 7/003
                                                    363/97

* cited by examiner

METHOD AND DESIGN OF LOW SHEET RESISTANCE MEOL RESISTORS

TECHNICAL FIELD

This application relates generally to resistors, and in particular, to resistors for use in semiconductor integrated circuits and a method for fabricating the same.

BACKGROUND

A resistor is a passive electrical component that may be used in electronic circuits. Resistors have been used to limit current flow, to adjust signal levels, bias active elements, or terminate transmission lines for various circuit applications. With development of semiconductor technology, resistors have been implemented within integrated circuits. Fabrication of an integrated circuit may include three stages: front-end-of-line (FEOL), middle-end-of-line (MEOL), and back-end-of-line (BEOL) stages. The FEOL stage includes forming source and drain regions of transistors upon a semiconductor substrate. The MEOL stage may include forming gate regions of the transistors and local interconnect layers proximate to the semiconductor substrate to connect the transistors. The BEOL stage may include forming metal interconnect layers to connect the transistors and other devices of the integrated circuit.

SUMMARY

An integrated circuit structure includes: a semiconductor substrate; a shallow trench isolation (STI) region in the semiconductor substrate; one or more active devices formed on the semiconductor substrate; and a resistor array having a plurality of resistors disposed above the STI region; wherein the resistor array comprises a portion of one or more interconnect contact layers that are for interconnection to the one or more active devices.

Optionally, the one or more interconnect contact layers are for implementing gate regions for the one or more active devices.

Optionally, the integrated circuit structure further includes two dummy regions, wherein the STI region is located between the two dummy regions Optionally, the resistor array has a sheet resistance of about 100 ohm/sq or less.

Optionally, the resistor array is made of tungsten or tantalum.

Optionally, at least one resistor in the resistor array has a length that is anywhere from 0.1 µm to 3 µm, and a width that is anywhere from 0.01 µm to 0.1 µm.

Optionally, the resistor array has at least five resistors.

Optionally, the one or more interconnect contact layers comprises a first interconnect contact layer and a second interconnect contact layer above the first interconnect contact layer, wherein the first interconnect contact layer is for implementing gate regions of the one or more active devices; and wherein at least one resistor in the resistor array comprises at least a part of the first interconnect contact layer, and/or at least a part of the second interconnect contact layer.

Optionally, the integrated circuit structure further includes a first via contact connecting to first ends of the resistors in the resistor array, and a second via contact connecting to second ends of the resistors in the resistor array.

Optionally, the plurality of resistors comprises a first resistor and a second resistor that are parallel to each other.

Optionally, at least two of the resistors have a same length.

Optionally, at least one of the resistors has an elongated configuration.

Optionally, the resistors comprise a first resistor and a second resistor, the first resistor having a longitudinal axis, wherein the first and second resistors are offset relative to each other in a direction that is along the longitudinal axis of the first resistor.

Optionally, the integrated circuit structure further includes an additional STI region, and an additional resistor array disposed above the additional STI region.

Optionally, the resistor array and the additional resistor array have a same configuration.

A method for fabricating a resistor array includes: providing a semiconductor substrate; and forming a resistor array having a plurality of resistors over a shallow trench isolation (STI) region in a semiconductor substrate; wherein at least one of the resistors in the resistor array is at least partially formed from a part of an interconnect contact layer, the interconnect contact layer being fabricated during a middle-end-of-line process for local interconnection to active devices.

Optionally, the interconnect contact layer is for implementing gate regions of one or more active devices.

Optionally, the interconnect contact layer is above another interconnect contact layer that is for implementing gate regions of one or more active devices.

Optionally, the at least one of the resistors is at least partially formed also from a part of an additional interconnect contact layer that is above the interconnect contact layer.

Optionally, the resistor array has a sheet resistance of about 100 ohm/sq or less.

Other features, embodiments, and advantageous will be described in the detail description.

BRIEF DESCRIPTION OF THE DRAWINGS

The drawings illustrate the design and utility of some features, in which similar elements are referred to by common reference numerals. These drawings are not necessarily drawn to scale. In order to better appreciate how the above-recited and other advantages and objects are obtained, a more particular description will be rendered, which are illustrated in the accompanying drawings. These drawings are not to be considered limiting in the scope of the claims.

FIG. 2-1 illustrates a cross-sectional view of the integrated circuit structure of FIG. 1 along line A-A' of FIG. 1.

FIG. 2-2 illustrates a cross-sectional view of the integrated circuit structure of FIG. 1 along line B-B' of FIG. 1.

FIG. 4-1 illustrates a cross-sectional view of the integrated circuit structure of FIG. 1 along line A-A' of FIG. 3.

FIG. 4-2 illustrates a cross-sectional view of the integrated circuit structure of FIG. 1 along line B-B' of FIG. 3.

FIG. 4-3 illustrates a cross-sectional view of the integrated circuit structure of FIG. 1 along line C-C' of FIG. 3.

FIGS. 6-1 to 6-14 are a sequence of cross-sectional schematic diagrams taken along line A-A' illustrating the steps of fabricating the integrated circuit of FIG. 3.

FIGS. 7-1 to 7-14 are a sequence of cross-sectional schematic diagrams taken along line C-C' illustrating the steps of fabricating the integrated circuit of FIG. 3.

FIG. 8 is a flow chart illustrating a process for fabricating a resistor in an integrated circuit.

DETAILED DESCRIPTION

Figure 1:
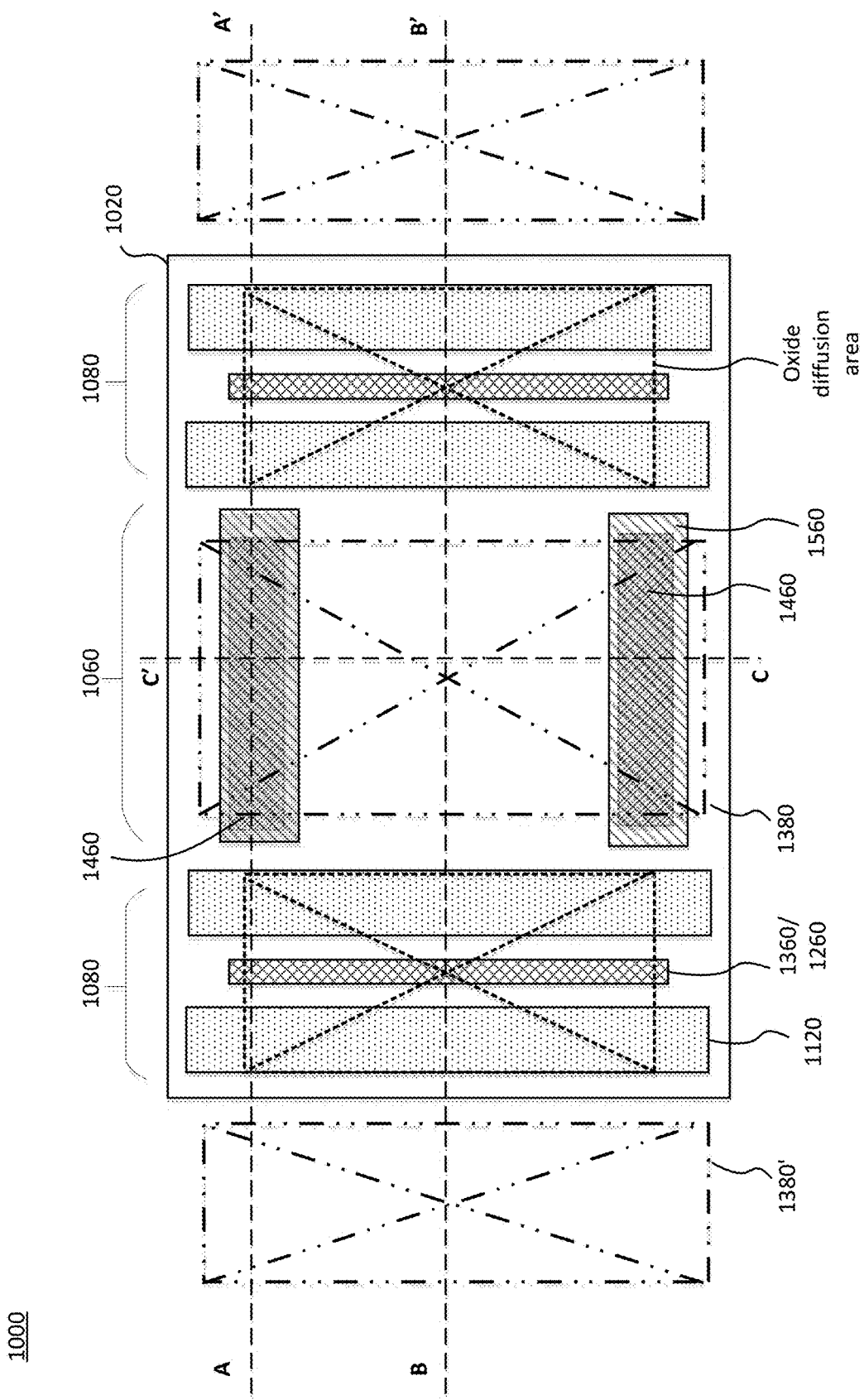
FIG. 1 illustrates a top-view of an integrated circuit structure with a high sheet resistance resistor.

Various features are described hereinafter with reference to the figures. It should be noted that the figures are not drawn to scale and that the elements of similar structures or functions are represented by like reference numerals throughout the figures. It should be noted that the figures are only intended to facilitate the description. They are not intended as an exhaustive description of the claimed invention or as a limitation on the scope of the claimed invention. In addition, an illustrated item need not have all the aspects or advantages shown. An aspect or an advantage described in conjunction with a particular item is not necessarily limited to that item and can be practiced in any other items even if not so illustrated.

Embodiments of present disclosure provide a resistor formed using a middle-end-of-line (MEOL) interconnect contact layer, and a method for fabricating the same. The resistor according to embodiments described herein has a low sheet resistance of about 100 ohm/sq (e.g., 100±10 ohm/sq) or less in drawn dimension, and uses less space with better electromigration immunity compared to conventional resistors. In addition, the method for forming a resistor according to embodiments described herein may be easily incorporated into current semiconductor fabrication processes without additional masks and processing steps.

Figures 1, 2:
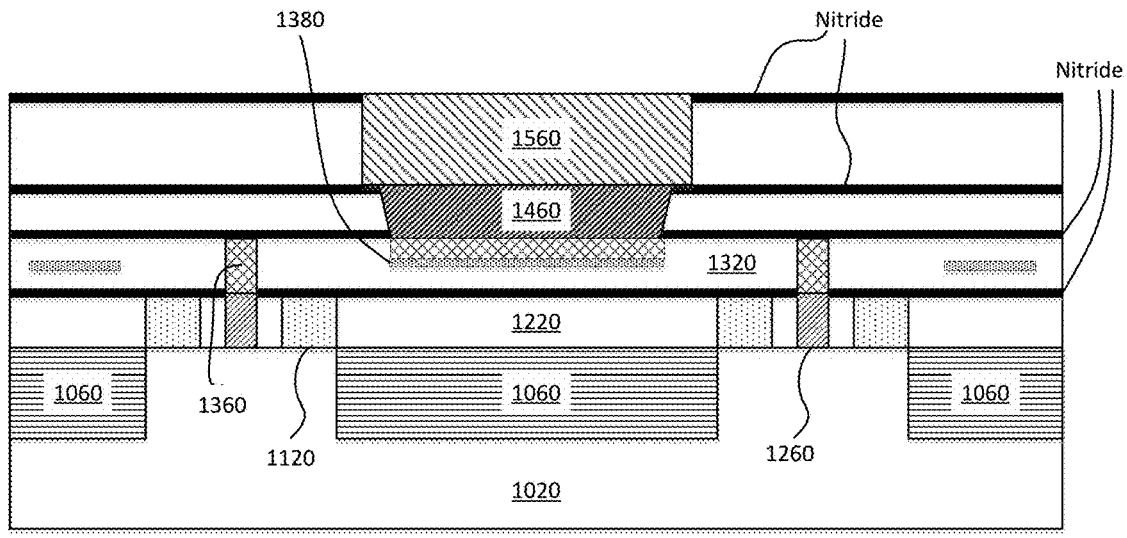
Figure 2:
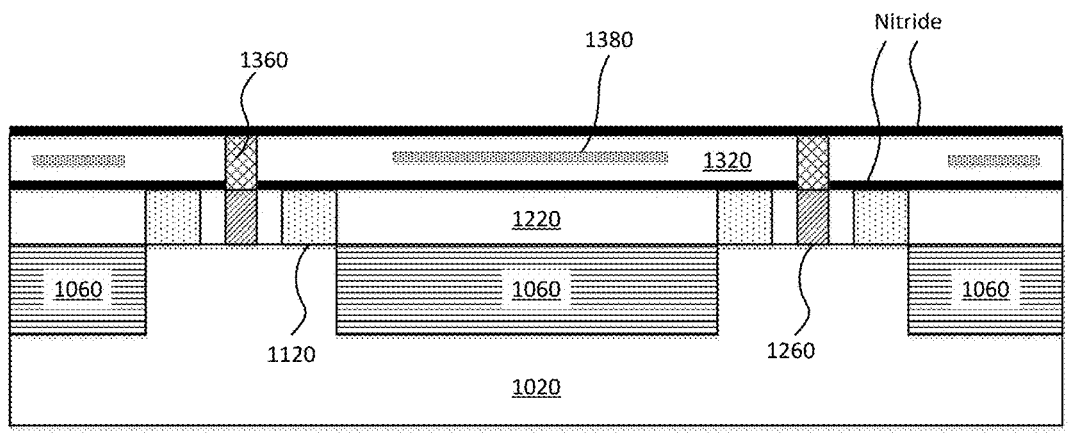

FIG. 1 illustrates an integrated circuit structure 1000 with resistors formed at a metal interconnect level. FIGS. 2-1 and 2-2 illustrate a cross-sectional view of the integrated circuit structure 1000 along lines A-A' and B-B' of FIG. 1 respectively. The integrated circuit structure 1000 includes a substrate 1020 having active regions (not shown), dummy regions 1080, and a shallow trench isolation (STI) region 1060. A STI region may be provided between two adjacent active regions. Such a STI region may be provided for preventing electrical current leakage between active devices in the respective active regions. Over the STI region 1060 is a resistor layer 1380 located in a dielectric layer 1320. The resistor layer 1380 is located above another dielectric layer 1220 where gate conductive regions 1120 and a first interconnect contact layer 1260 are formed. The resistor layer 1380 may comprise a metal material (e.g., titanium nitride (TiN)). The resistor layer 1380 may be formed by deposition process, such as evaporation or sputtering. A second interconnect contact layer 1360 is then formed over terminals (e.g., at opposite ends) of the resistor layer 1380. A via contact layer 1460 is formed over the second interconnect contact layer 1360 to provide vertical connection between the resistor layer 1380 to the first level of metallization 1560.

As shown in FIGS. 1, 2-1, and 2-2, the resistor layer 1380 with its terminals connected to the second interconnect contact layer 1360 form a resistor. The resistor as formed above may have a high sheet resistance (Hi-R) (e.g., 600-1000 ohm/sq). In other embodiments, the sheet resistance may have other values. Also, in some cases, the resistor may have a length that is 0.3 µm, and a width that is 0.36 µm. Such dimensions of the resistor allow the resistor to have a high sheet resistance (like the examples mentioned above).

However, in certain applications, it may be desirable to have resistors in low resistance. For example, terminating resistors used at the end of a transmission line to prevent transmission line reflections may be in low resistance (e.g., 50 ohm). In order to form a terminating resistor using Hi-R resistors of FIG. 1, it may require a large area by placing multiple Hi-R resistors in parallel. Thus, it may be desirable to develop a resistor with low sheet resistance for use in integrated circuits and a method for fabricating the same without additional mask and additional processing steps. Also, certain high speed applications may require high current drive through terminating resistors. Accordingly, large and wide Hi-R resistors may be needed in order to pass electromigration despite their area penalty. Thus, it may also be desirable to have a smaller resistor that can provide high electromigration immunity.

Embodiments of present disclosure provide a resistor formed using a middle-end-of-line (MEOL) interconnect contact layer, and a method for fabricating the same. The resistor according to embodiments described herein has a low sheet resistance of about 100 ohm/sq (e.g., 100±10 ohm/sq) or less in drawn dimension, and uses less space with better electromigration immunity compared to conventional resistors. In addition, the method for forming a resistor according to embodiments described herein may be easily incorporated into current semiconductor fabrication processes without additional masks and processing steps.

Figure 3:
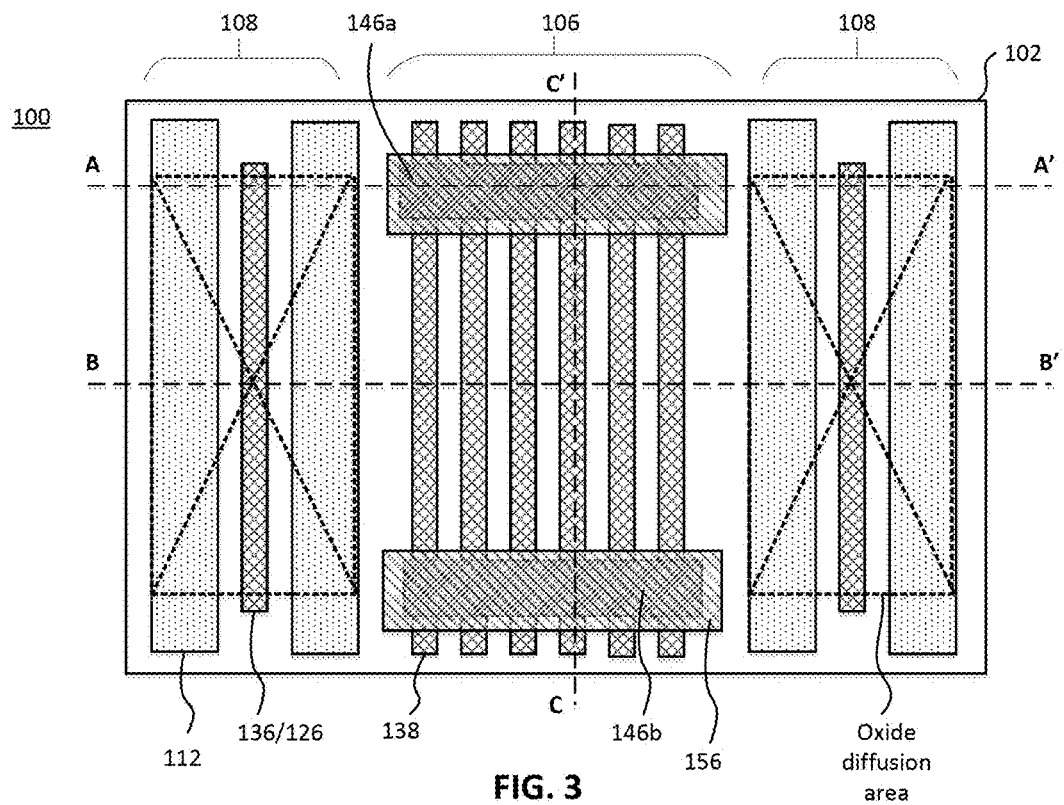
FIG. 3 illustrates a top-view of an integrated circuit structure with a low sheet resistance resistor.
Figures 1, 4:
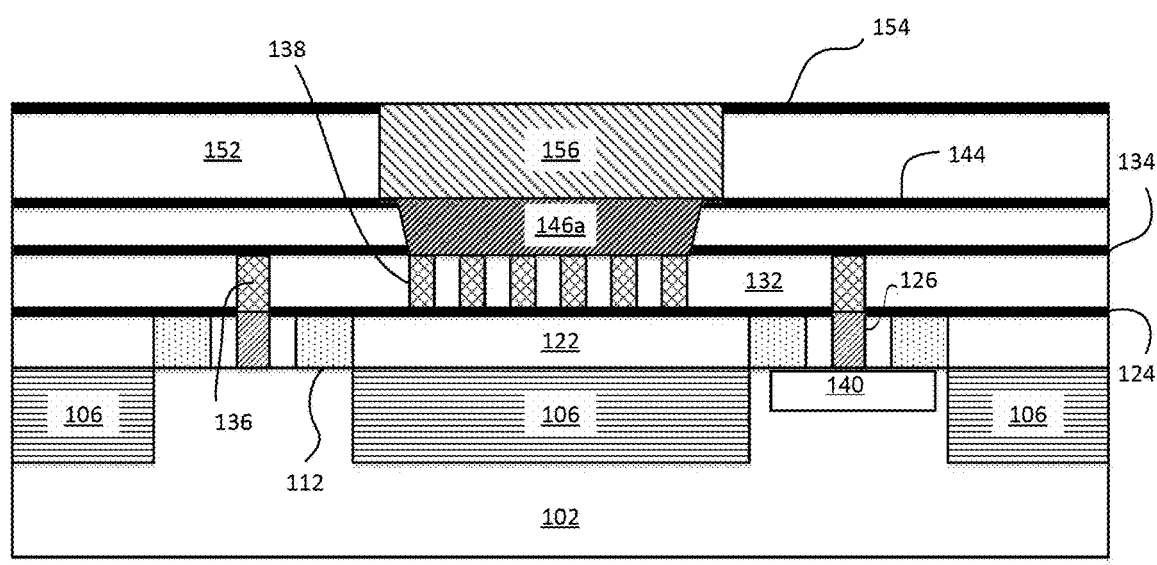
Figures 2, 4:
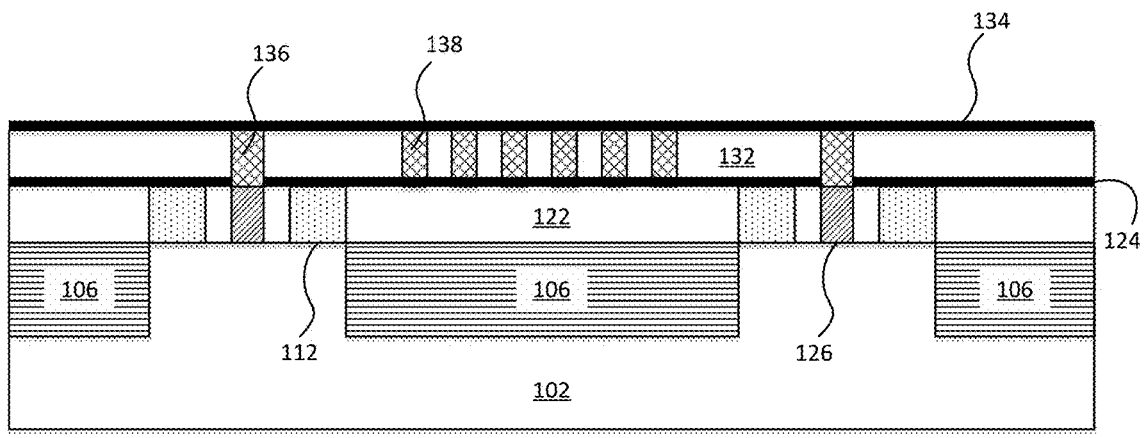
Figures 3, 4:
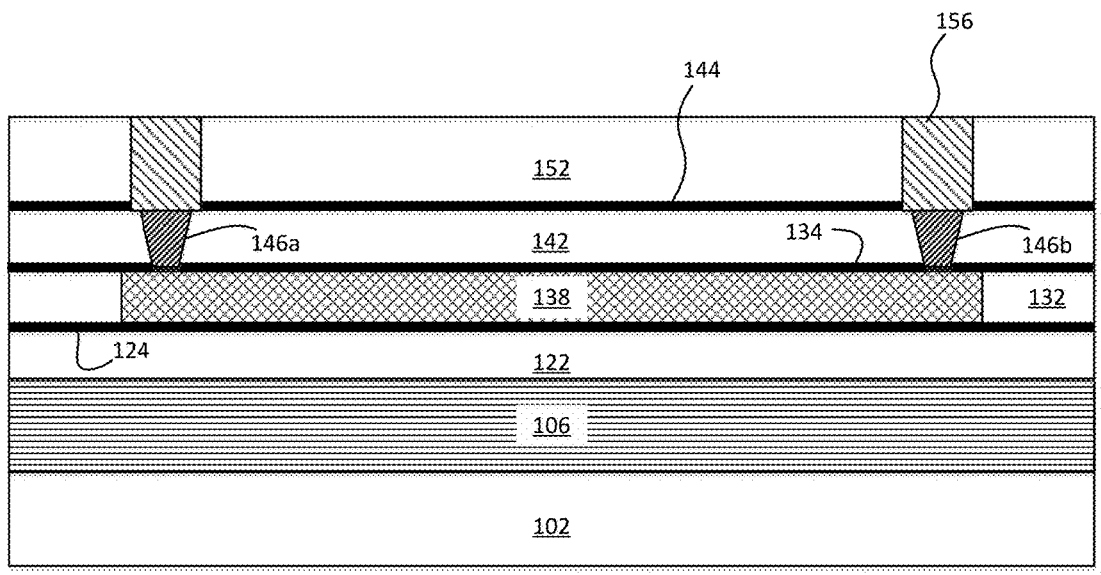

FIG. 3 illustrates a top-view of an integrated circuit structure 100 with a plurality of resistors in a resistor array 138. FIGS. 4-1 to 4-3 illustrate a cross-sectional view of the integrated circuit structure 100 along lines A-A', B-B' and C-C' in FIG. 3, respectively. The structure 100 has a substrate 102 that includes one or more active devices (not shown) in one or more active regions, a shallow trench isolation (STI) region 106, and dummy regions 108 next to the STI region 106. The dummy regions 108 are provided to make metal density more uniform for a chemical mechanical polishing (CMP) process and thus leading to a more uniform post-polish layer topography.

As shown in the figure, the integrated circuit structure 100 includes two pairs of gate regions 112, interconnect contact layers 136, 126 between two gate regions 112 in each of the two pairs of gate regions 112, and dummy regions 108. The gate regions 112, and the interconnect contact layers 126, 136 are part of the dummy region 108 for providing a more uniform density. The interconnect contact layers 136, 126 are formed over active regions (not shown). The interconnect contact layers include a first interconnect contact layer 126, and a second interconnect contact layer 136. The second interconnect contact layer 136 is formed over the first interconnect contact layer 126 as shown in FIGS. 4-1 and 4-2. The interconnect contact layers 126, 136 include contacts that provide local interconnects to the source and drain regions of an active device 140 in the integrated circuit structure 100. The first and second interconnect contact layers 126, 136 are layers formed during a MEOL stage during fabrication of the integrated circuit structure 100.

Referring to FIGS. 4-1 and 4-2, the integrated circuit structure 100 also includes a resistor array 138 having a plurality of resistors disposed over the STI region 106. The resistor array 138 is formed with at least a part of the second interconnect contact layer 136, so that the resistor array 138 is at the same layer level as the second interconnect contact layer 136. A first via contact 146a is formed over terminals at first ends of the resistors in the resistor array 138. Also, a second via contact 146b is formed over terminals at second ends (opposite from the first ends) of the resistors in the resistor array 138. The first and second via contacts 146a, 146b may be formed in a same via contact layer. As shown in FIG. 4-3, a first level of metallization 156 is provided above each of the via contacts 146a, 146b to form ports for connection between active devices in the integrated circuit structure 100, as well as to connect to the resistor array 138 via the via contacts 146a, 146b.

As shown in FIG. 3, the first via contact 146a extends across first ends of the respective resistors in the resistor array 138, and the second via contact 146b extends across second ends of the respective resistors in the resistor array 138. Thus, the resistors in the resistor array 138 are connected in parallel.

While FIGS. 4-1 to 4-3 show the resistor array 138 being made of at least a part of the second interconnect contact layer 136, the resistor arrays 138 may be formed using any one or more of the MEOL interconnect contact layers. In some embodiments, the resistor array 138 may be made of at least a part of the first interconnect contact layer 126 (i.e., the resistor array 138 may be made from the same layer as the first interconnect contact layer 126), instead of the second interconnect contact layer 136. Also, in some embodiments, the resistor array 138 may be formed with both the first and second contact layers 126 and 136 to achieve a desired resistance value.

Figure 5:
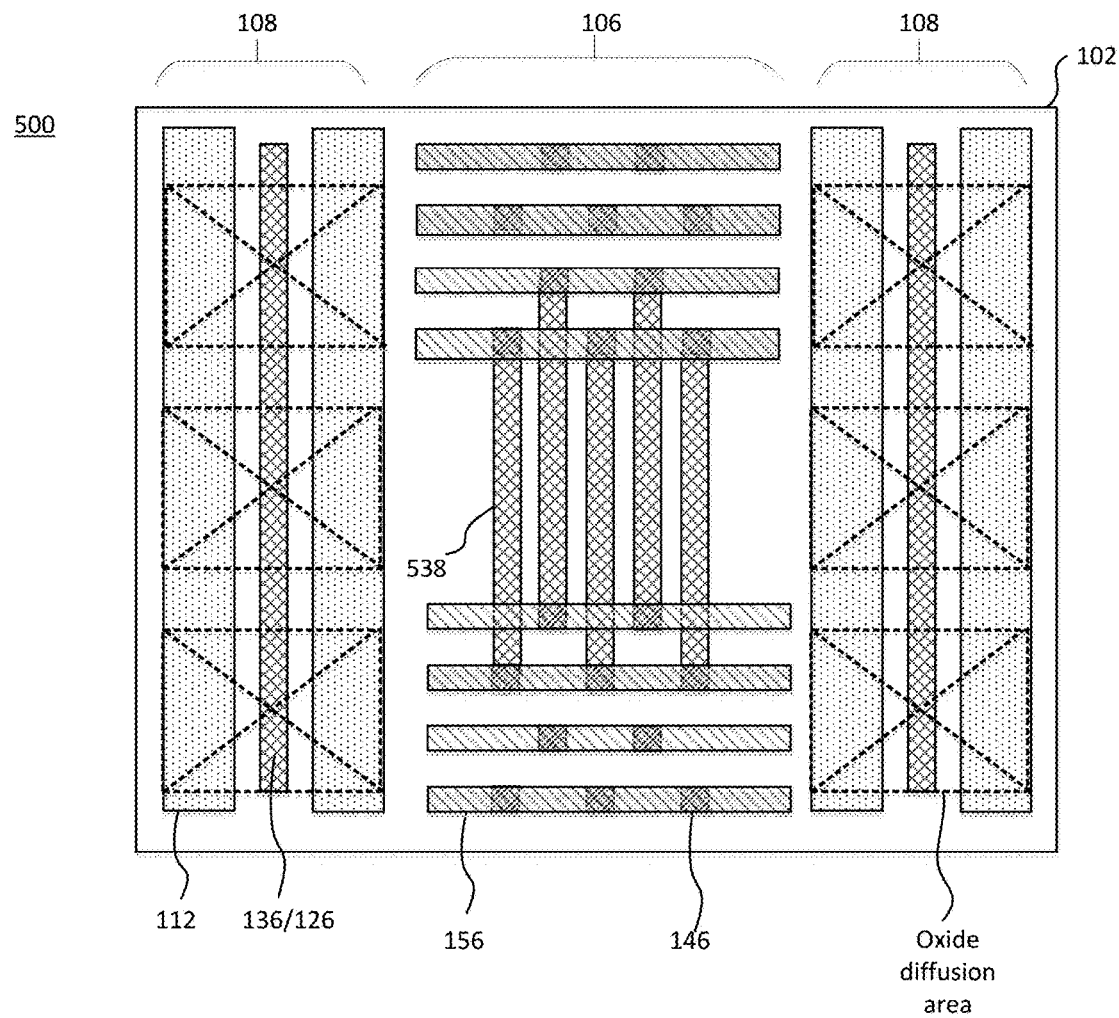
FIG. 5 illustrates a top-view of an integrated circuit structure with a low sheet resistance resistor.

FIG. 5 shows a top view of an integrated circuit structure 500 with a resistor array 538. Same reference numerals are used for the same layers as those shown in FIG. 3. The integrated circuit structure 500 is similar to the integrated circuit 100, except that at least two resistors in the resistor array 538 are not aligned. As shown in the figure, every other resistor in the resistor array 538 is shifted longitudinally with respect its adjacent resistor to create an alternating pattern for the resistor array 538. In the illustrated embodiments, the integrated circuit structure 500 also includes a plurality of metallization 156 at each of the opposite ends of the resistor array 538. In particular, a first metallization 156 connects ends of the resistors in the resistor array 538 that are at the same longitudinal position. Thus, the first metallization 156 connects to an end of every other resistor in the resistor array 538. Similarly, a second metallization 156 connects to an end of every other resistor in the resistor array 538. As shown in the figures, the via contacts 146 for connection to resistors' ends in the resistor array 538 occupy less space than the configuration shown in FIG. 3. In particular, the via contact 146 in FIG. 5 is less wide compared to the via contact 146a in FIG. 3.

FIGS. 6-1 to 6-14 and FIGS. 7-1 to 7-14 are a sequence of cross-sectional schematic diagrams taken along line A-A' and C-C' illustrating the steps of fabricating the integrated circuit structure 100 of FIG. 3. The fabrication process starts with a substrate 102 and a passivation layer 104 disposed over the substrate 102. The substrate 102 may be a semiconductor material. Examples of materials that may be used for the substrate 102 include silicon (Si), germanium (Ge), silicon germanium (SiGe), silicon carbide (SiC), layered semiconductors such as Si/SiGe, and the like. The passivation layer 104 may include an insulating material such as an oxide, nitride, oxynitride, or any combination thereof. The passivation layer 104 may be formed over the substrate 102 utilizing any conventional deposition process including chemical vapor deposition (CVD), plasma enhanced chemical vapor deposition (PECVD), chemical solution deposition, evaporation, atomic layer deposition (ALD), or any of other deposition processes.

Figures 1, 6:
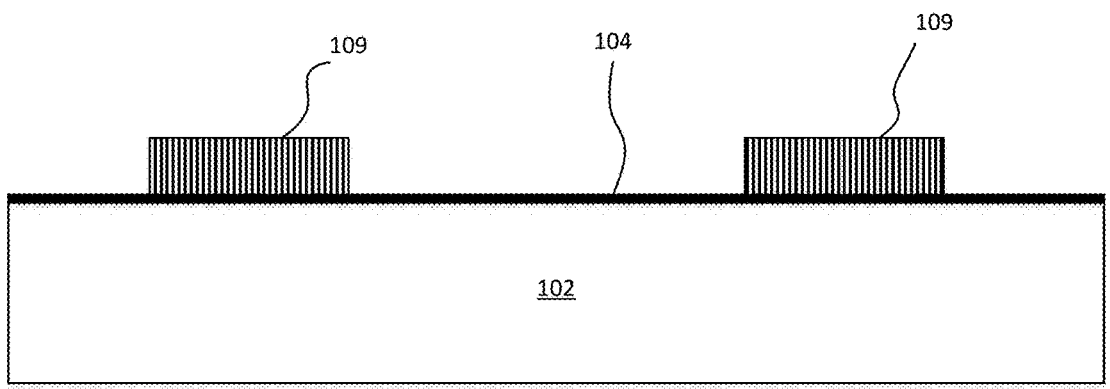
Figures 1, 7:
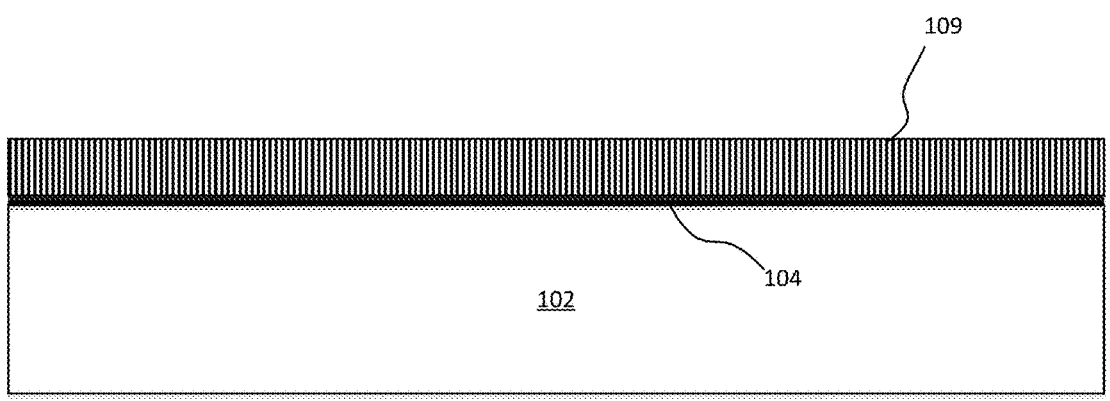
Figures 2, 7:
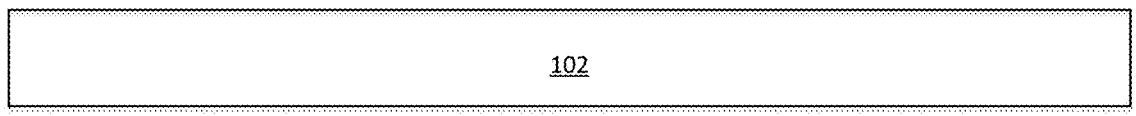
Figures 3, 7:
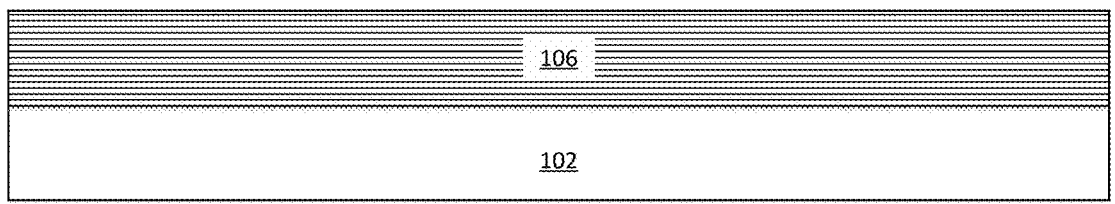
Figures 4, 7:
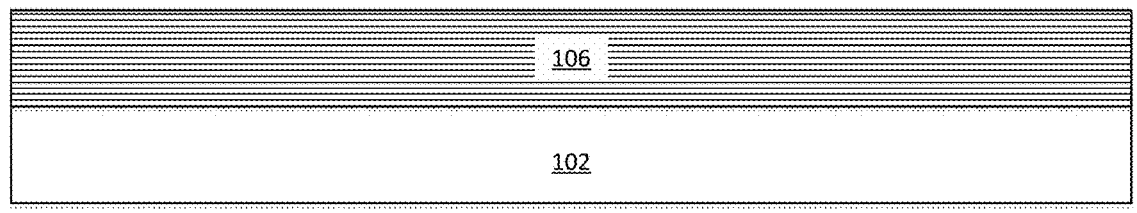
Figures 5, 7:
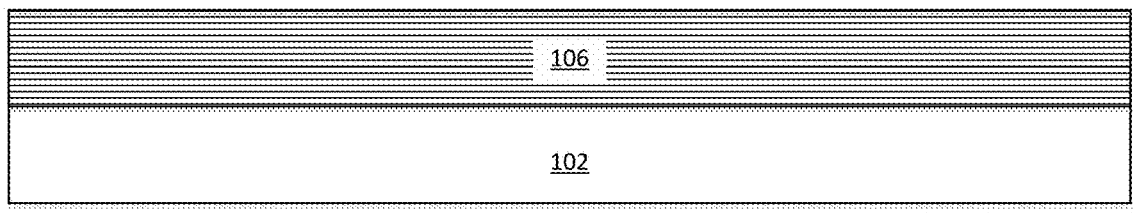
Figures 6, 7:
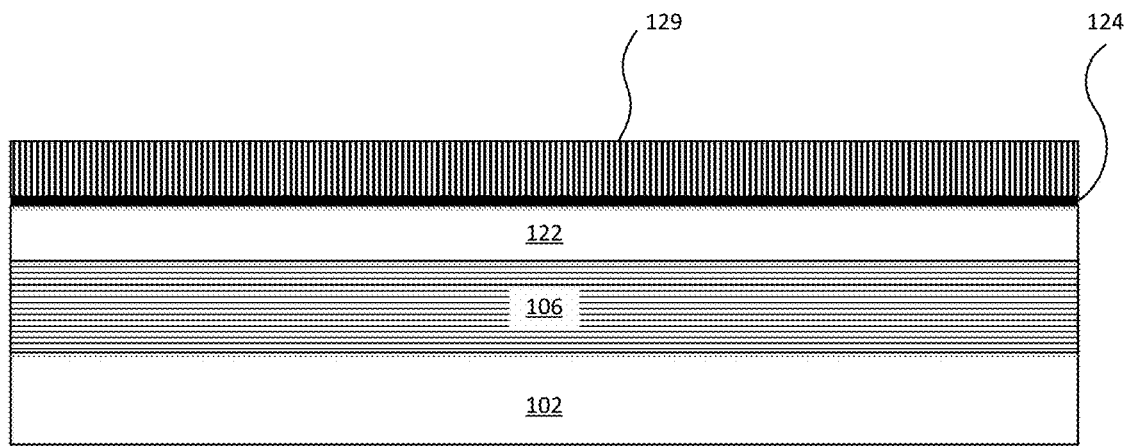
Figure 7:
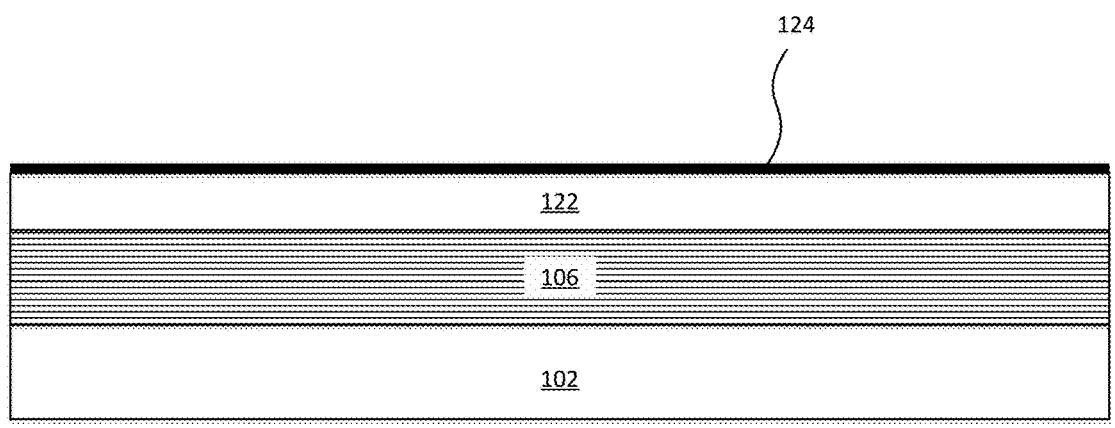

FIGS. 6-1 and 7-1 illustrates a patterned photoresist layer 109 provided over the substrate 102 to define active regions (not shown), a shallow trench isolation (STI) region 106, and dummy regions next to the STI region 106. Specifically, the process may include applying a photoresist layer 109 above the surface of the passivation layer 104 and/or the substrate 102, exposing the photoresist layer 109 to a pattern of radiation, and developing the pattern into the photoresist layer 109 using a conventional resist developer.

An etching process is then followed to etch the exposed portions of the passivation layer 104. Any etching process may be used, including but not limited to dry etching technique (such as a plasma etch) or a wet etching technique (such as a chemical etch). Another etching process is performed to remove the exposed portions of the substrate 102 in which the STI regions 106 are to be formed as shown in FIGS. 6-2 and 7-2.

As shown in FIGS. 6-3 and 7-3, a trench dielectric material is deposited over the substrate 102, followed by an etch back process to remove excess material over the surface of the substrate 102 to form the STI region 106. Examples of the trench dielectric material for the STI region 106 include, but are not limited to, tetraethyorthosilicate (TEOS), a high density plasma oxide (HDPO), etc. The passivation layer 104 is then removed.

Next, as shown in FIGS. 6-4 and 7-4, gate dielectric and a gate conductive material (shown as a layer 111) are deposited over the substrate 102. The gate dielectric material may include any insulating material such as an oxide, nitride, oxynitride, or a combination thereof. Examples for the gate dielectric layer include silicon oxide (SiO2), titanium dioxide (TiO2), aluminum oxide (Al2O3), and the like. The gate conductive material may include any conductive material such as, doped polysilicon, metals, metal silicides, metal nitrides, or any combination thereof. A patterned photoresist layer 119 is provided over the layer 111 to define the gate regions in the layer 111 as shown in FIGS. 6-4 and 7-4.

As shown in FIGS. 6-5 and 7-5, an etching process is then performed on the layer 111 to etch away the conductive material not defined for the gate regions. A gate formation process is then followed to form gate region 112 over the active regions (not shown) and the dummy regions of the substrate 102.

Next, as shown in FIGS. 6-6 and 7-6, a dielectric layer 122 and a passivation layer 124 are deposited over the gate regions 112. The dielectric layer 122 may include high dielectric materials. Examples for the dielectric layer 122 include SiO2 and TEOS. The dielectric layer 122 may have a thickness that is anywhere from 80-100 nm. In other embodiments, the dielectric layer 122 may have a thickness that is less than 80 nm, or more than 100 nm. The passivation layer 124 may include an insulating material such as an oxide, nitride, oxynitride, or any combination thereof. In one embodiment, the passivation layer 124 includes nitride (N). The dielectric layer 122 may be formed using a conventional deposition process (e.g., CVD, PECVD. Evaporation, ALD or chemical solution deposition, etc.) which may be the same or different from the deposition process used in forming the passivation layer 104/124.

As shown in FIGS. 6-6 and 7-6, a patterned photoresist layer 129 is then provided above the passivation layer 124 to define a first interconnect contact layer 126 (shown in FIG. 6-7) to be formed in the dielectric layer 122 over the active and dummy regions. The passivation layer 124 and the dielectric layer 122 are patterned and etched to remove the exposed portions in which the first interconnect contact layer 126 is to be formed over the active and dummy regions. A conductive material is deposited over the substrate 102, followed by a CMP process to polish the conductive material back to passivation layer 124. The first interconnect contact layer 126 is thus formed as shown in FIGS. 6-7 and 7-7. Examples of the conductive material suitable for the first interconnect contact layer 126 include, but are not limited to, tungsten (W), tantalum (Ta), or any of other metals or alloys. The first interconnect contact layer 126 includes active contacts that provide local interconnects to the source region and drain region of the active devices. The first interconnect contact layer 126 are formed in the same layer as the gate region 112.

Figures 2, 6:
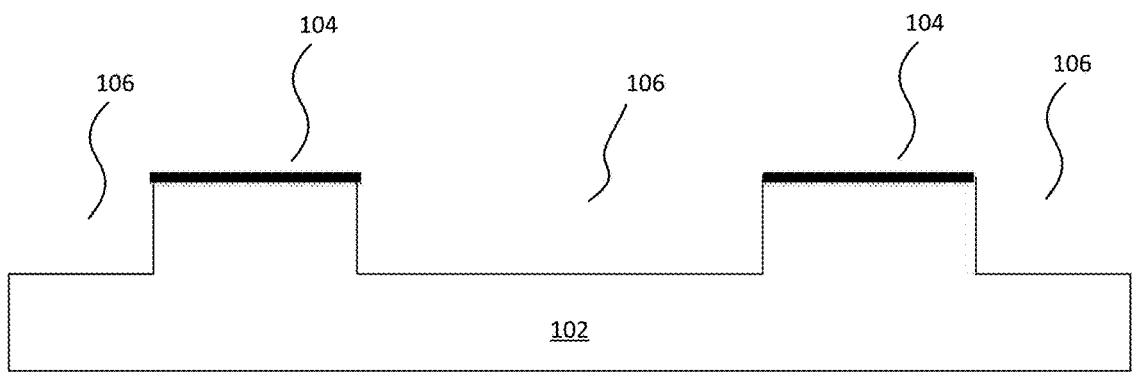
Figures 3, 6:
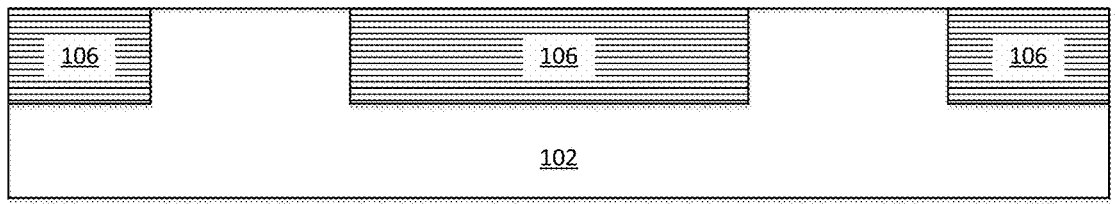
Figures 4, 6:
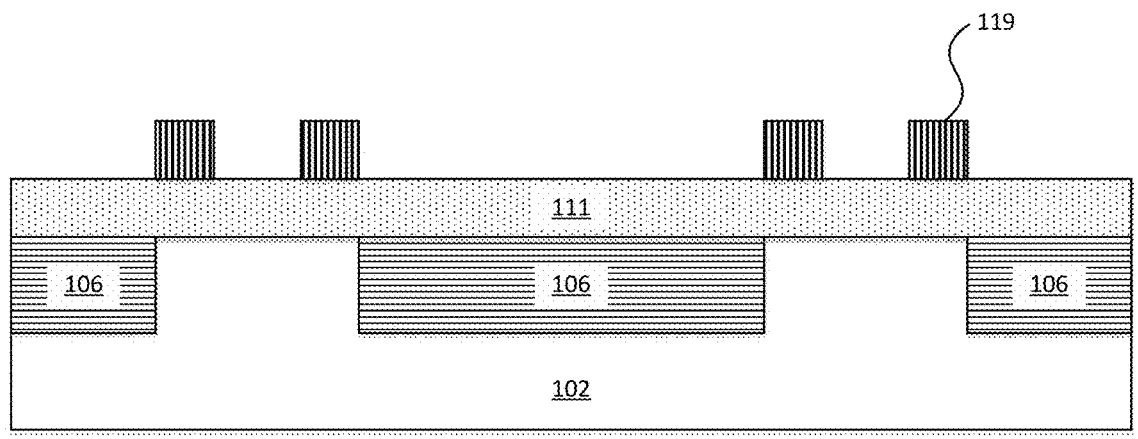
Figures 5, 6:
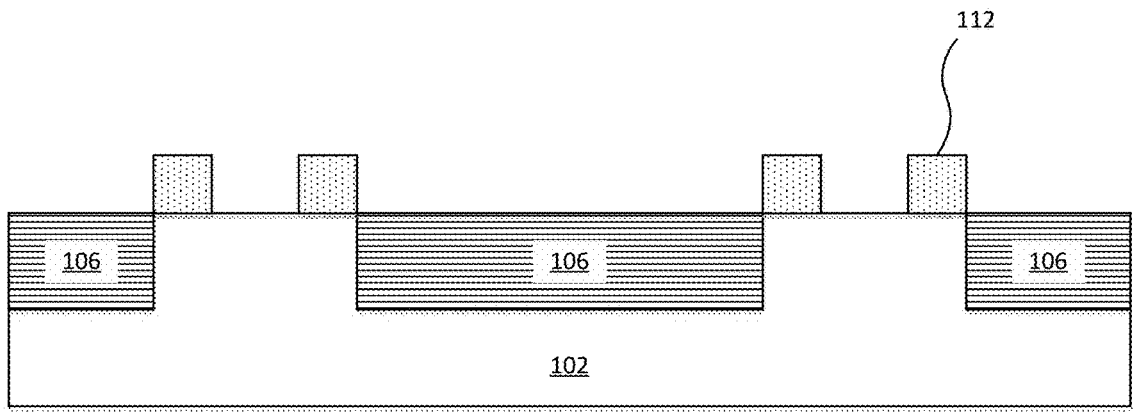
Figure 6:
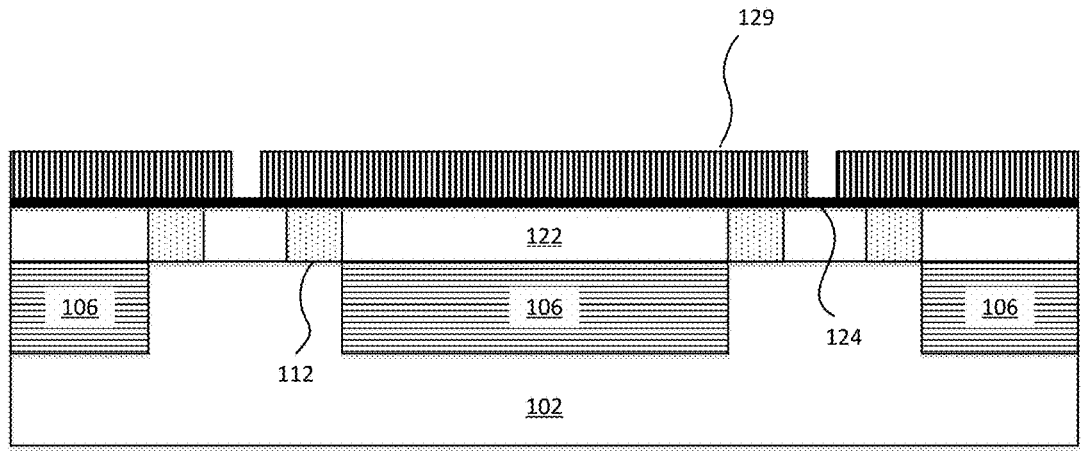
Figures 6, 7:
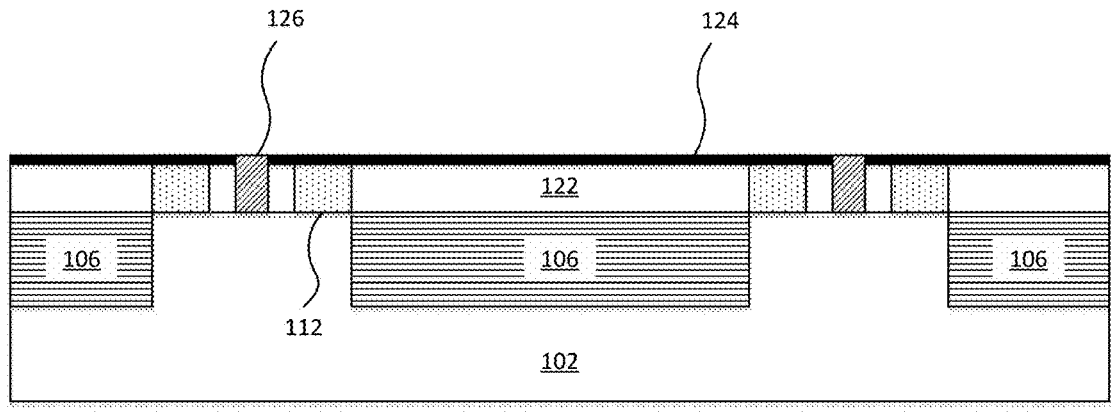
Figures 6, 7, 8:
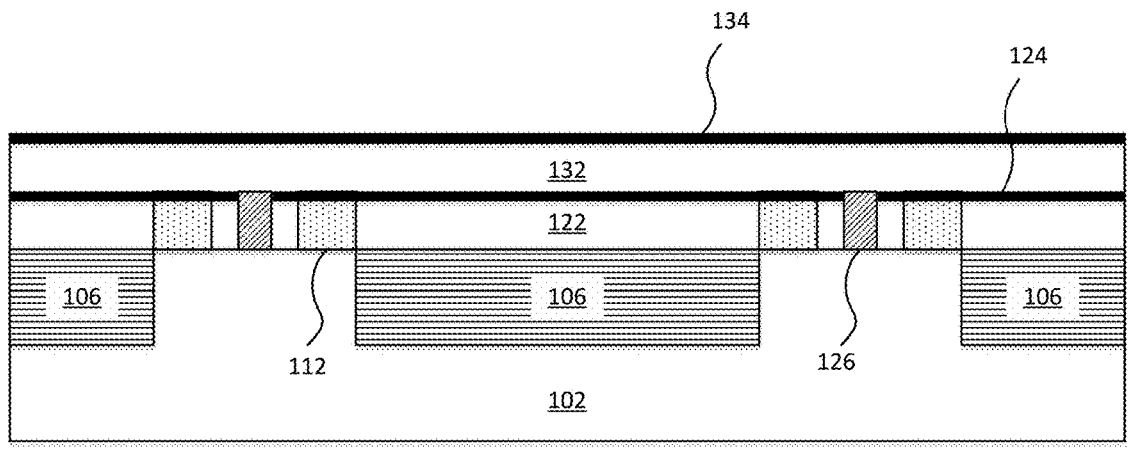
Figures 7, 8:
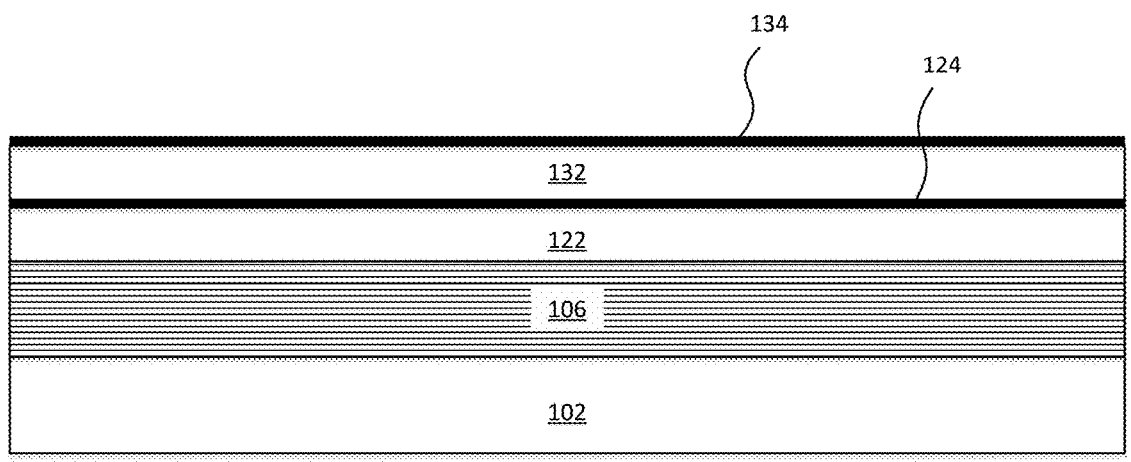
Figures 6, 7, 8, 9:
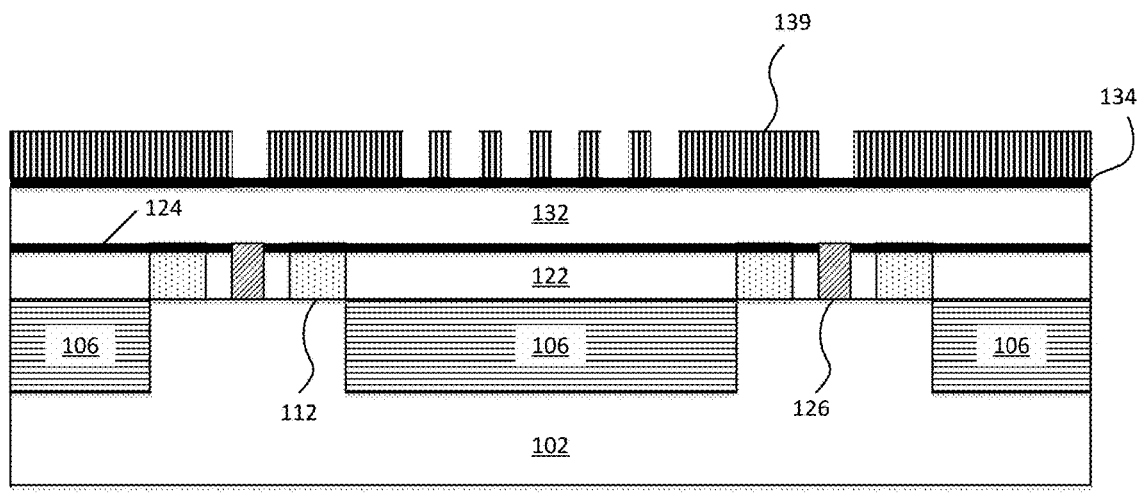
Figures 7, 8, 9:
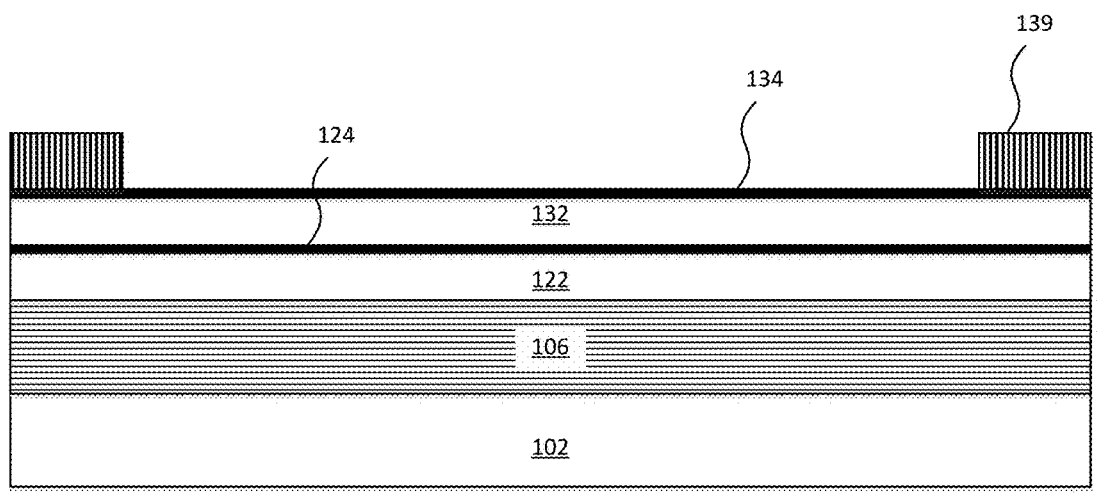
Figures 6, 7, 8, 9, 10:
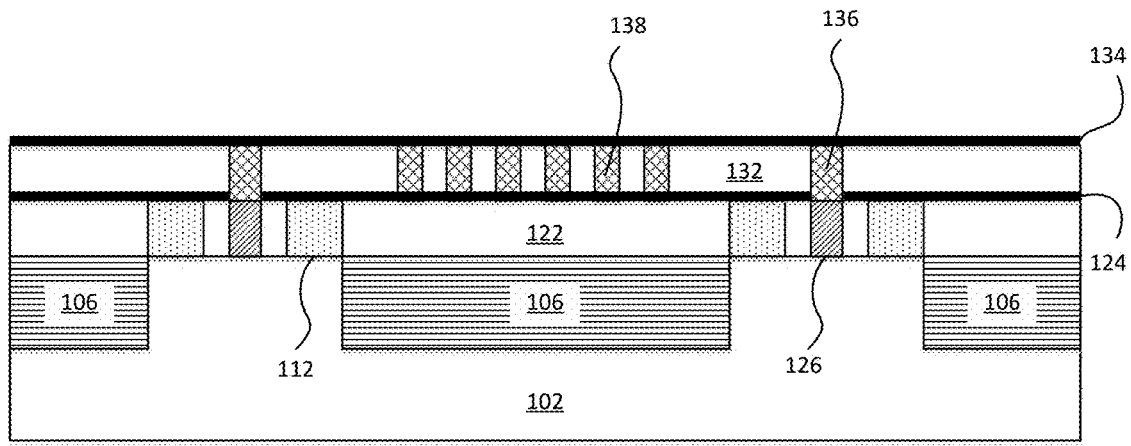
Figures 7, 8, 9, 10:
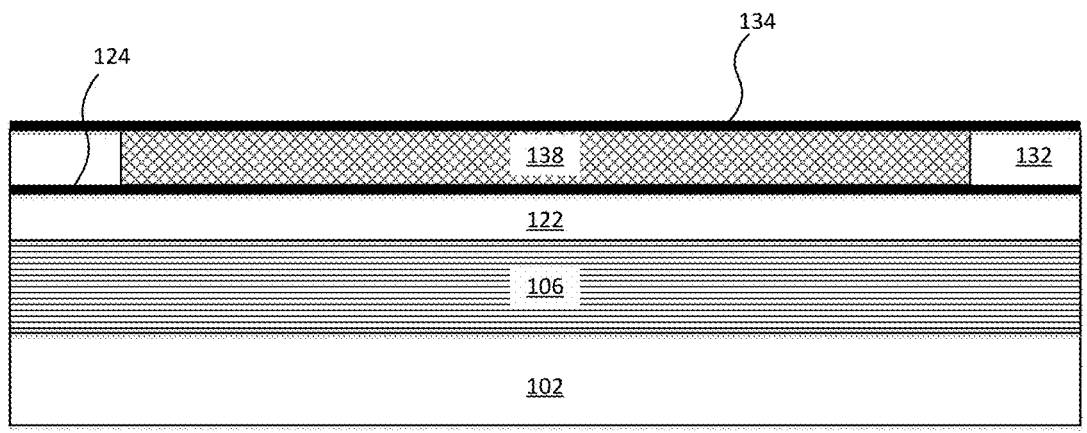
Figures 6, 7, 8, 9, 10, 11:
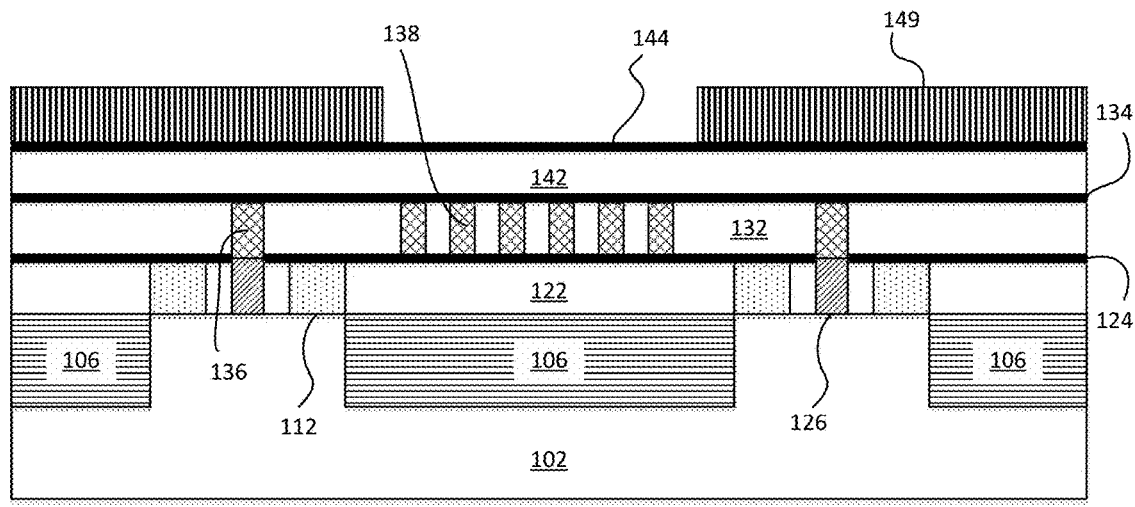
Figures 7, 8, 9, 10, 11:
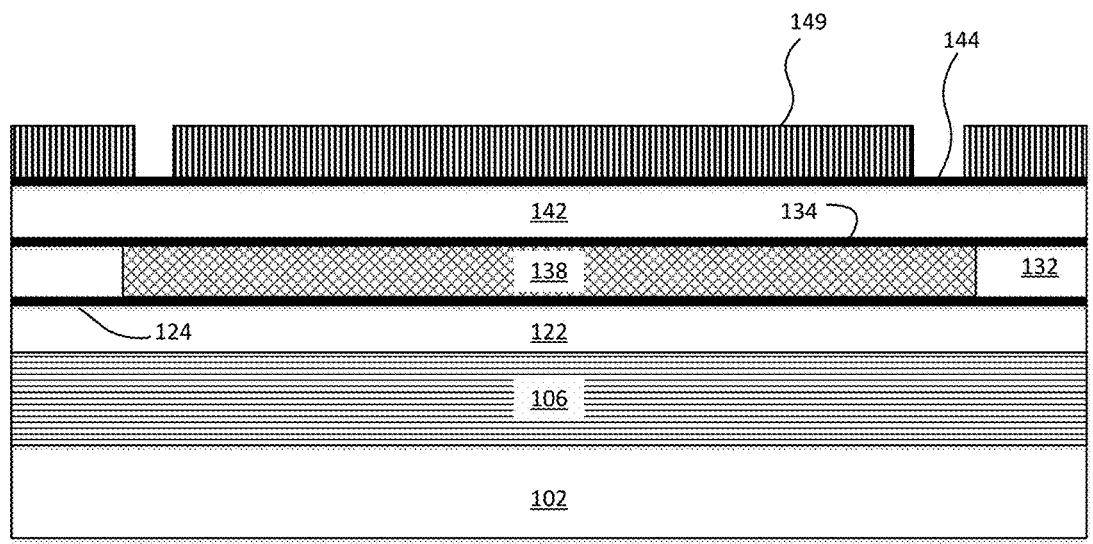
Figures 6, 7, 8, 9, 10, 11, 12:
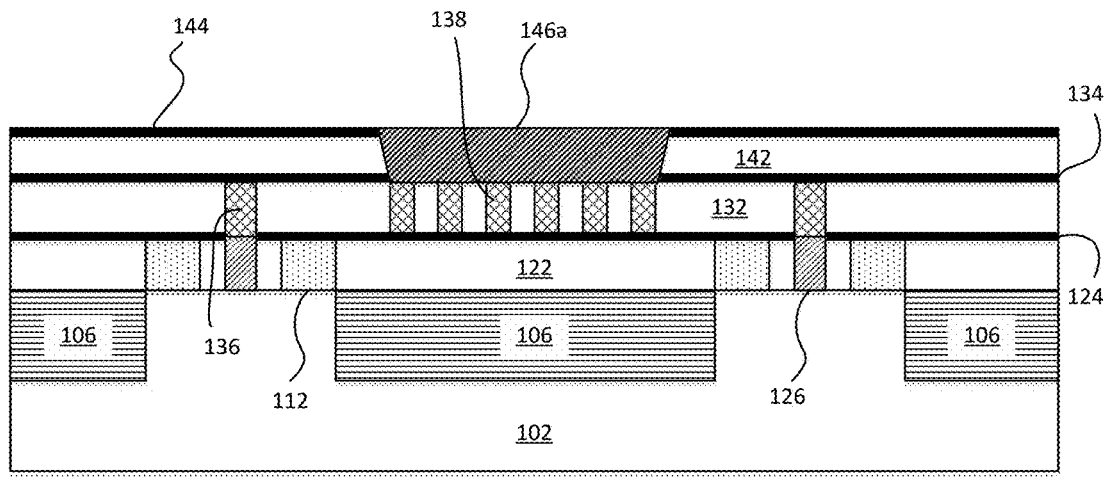
Figures 7, 8, 9, 10, 11, 12:
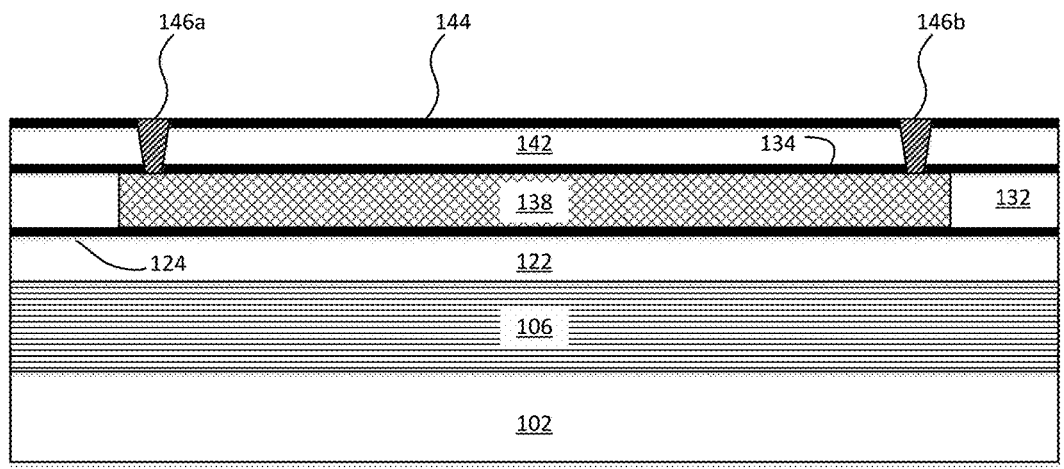
Figures 6, 7, 8, 9, 10, 11, 12, 13:
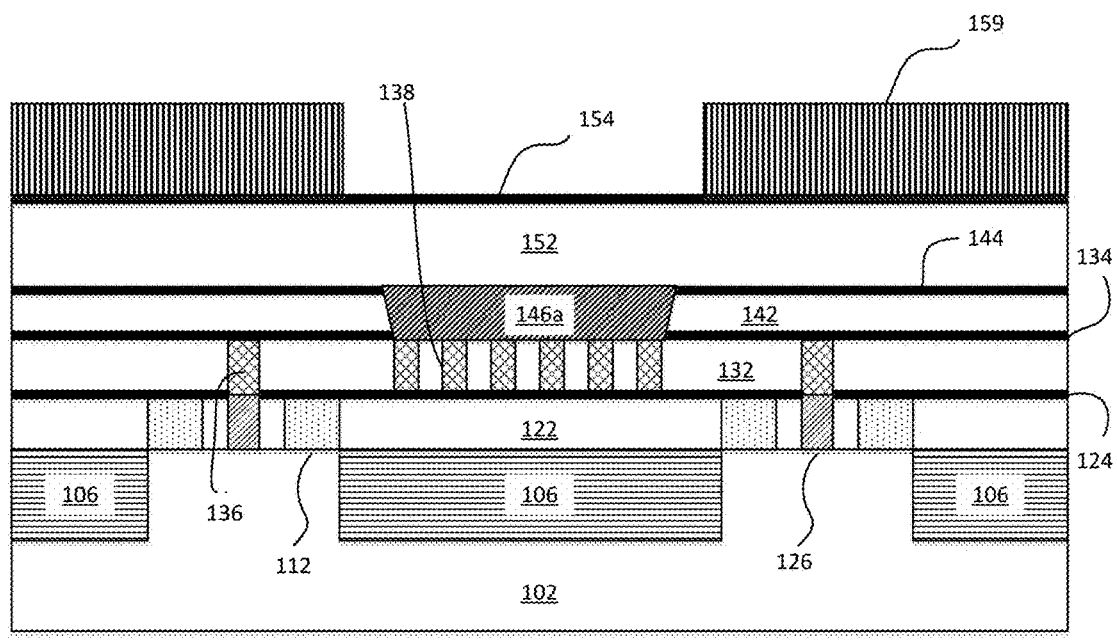
Figures 7, 8, 9, 10, 11, 12, 13:
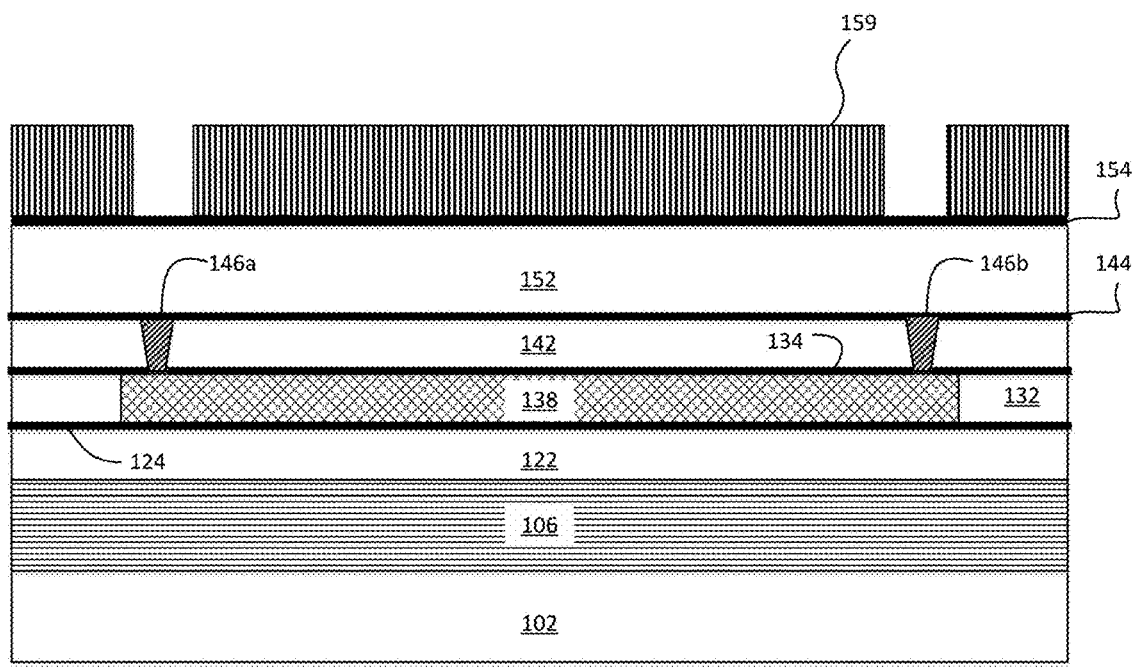
Figures 6, 7, 8, 9, 10, 11, 12, 13, 14:
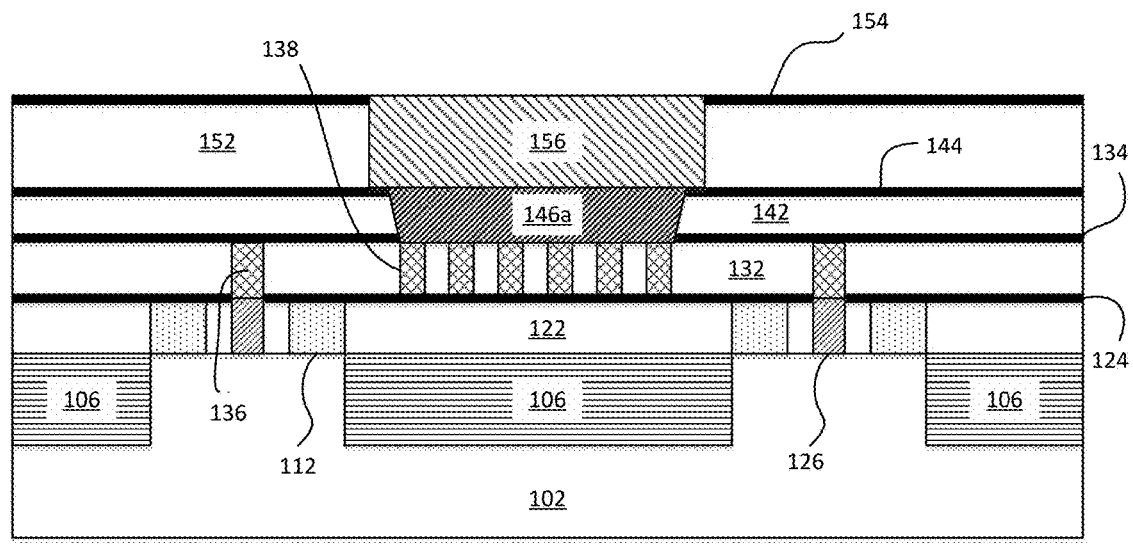
Figures 7, 8, 9, 10, 11, 12, 13, 14:
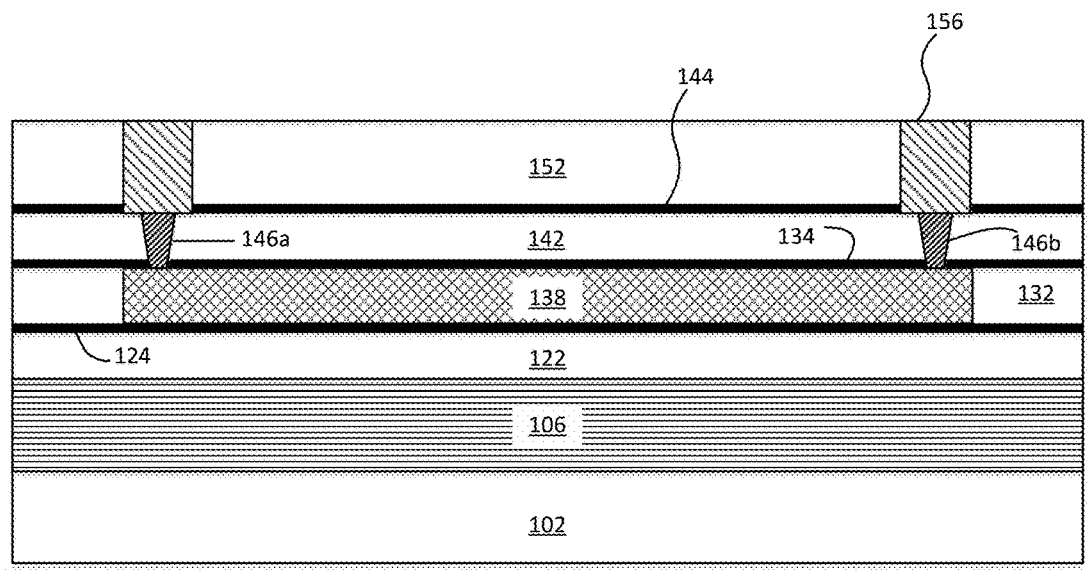
Figure 8:
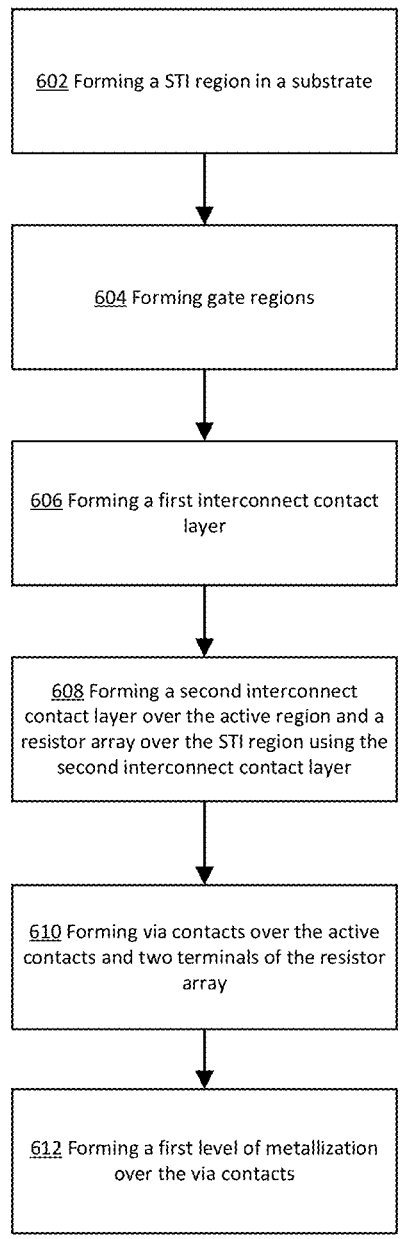

Next, as shown in FIGS. 6-8 and 7-8, another dielectric layer 132 and a passivation layer 134 are deposited over the substrate 102. The dielectric layer 132 may include high dielectric materials. Examples for the dielectric layer 132 include SiO2 (e.g., Carbon-doped SiO2) and TEOS. The dielectric layer 132 may have a thickness that is anywhere from 20 to 70 nm. In other embodiments, the dielectric layer 132 may have a thickness that is less than 20 nm or more than 70 nm. The passivation layer 134 may include an insulating material such as an oxide, nitride, oxynitride, or any combination thereof. In one embodiment, the passivation layer 134 includes nitride (N).

As shown in FIGS. 6-9 and 7-9, a patterned photoresist layer 139 is then provided over the passivation layer 134 to define a second interconnect contact layer 136 (shown in FIG. 6-10) to be formed in the dielectric layer 132 over the active regions and dummy regions. The patterned photoresist layer 139 also defines a plurality of resistors in a resistor array 138 to be formed with the second interconnect contact layer 136 over the STI regions 106 as shown in FIGS. 6-10 and 7-10. Each of the resistors in the resistor array 138 may have a length measured along a longitudinal axis of the resistor that is anywhere from 0.1 to 3 µm (and more preferably, anywhere from 0.2 to 2 µm), and a width that is anywhere from 0.01 to 0.1 µm (and more preferably, anywhere from 0.02 to 0.05 µm). In other embodiments, the length may be more than 3 µm. In some embodiments, the resistor array 138 over a STI region includes six resistors. In other embodiments, the resistor array 138 may have more than six resistors, or fewer than six resistors. An etching process may be carried out to remove the exposed portions of the passivation and dielectric layers 134, 132, in which parts of the second interconnect contact layer 136 above the first interconnect contact layer 126, and other parts of the second interconnect contact layer 136 forming the resistor array 138, are to be formed over the active, dummy and STI regions. A conductive material for the second interconnect contact layer 136 is deposited over the substrate 102, followed by a CMP process to polish the conductive material back to passivation layer 134. The second interconnect contact layer 136, including the parts forming the resistor array 138, are thus formed as shown in FIGS. 6-10 and 7-10. Examples of conductive material suitable for the second interconnect contact layer 136 and the resistor arrays 138 include, but are not limited to, tungsten (W), tantalum (Ta), or any of other metals or alloys.

In some embodiments, the second interconnect contact layer 136 are made of the same material as the first interconnect contact layer 126. In some embodiments, the second interconnect contact layer 136 are made of a different material from the first interconnect contact layer 126. The second interconnect contact layer 136 formed on the first interconnect contact layer 126 includes active contacts that provide local interconnects to the first interconnect contact layer 126 and active devices. The second interconnect contact layer 136 is also used to form the plurality of resistors in the resistor array 138 over the STI region 106

Next, as shown in FIGS. 6-11 and 7-11, a dielectric layer 142 and a passivation layer 144 are deposited over the substrate 102. The dielectric layer 142 may include an oxide, nitride, oxynitride or any combination thereof. The dielectric layer 142 may have a thickness in the range of about 10 nm (e.g., 10 nm±2 nm). In other embodiments, the dielectric layer 142 may have a thickness that is greater than 10 nm or less than 10 nm. The passivation layer 144 may include an insulating material such as an oxide, nitride, oxynitride, or any combination thereof. In one embodiment, the passivation layer 144 includes nitride (N). A patterned photoresist layer 149 is then provided over the passivation layer 144 to define a via contact (e.g., the via contact 146a/146b shown in FIG. 3) to be formed in the dielectric layer 142 over the second interconnect contact layer 136 in the active region (not shown). In particular, the patterned photoresist layer 149 defines a via contact layer 146a and a via contact 146b to be formed over two respective terminals at the opposite ends of the resistor array 138 above the STI region 106 as shown in FIG. 3 and (will be shown in FIG. 7-12).

Next, as shown in FIGS. 6-12 and 7-12, the dielectric layer 142 and the passivation layer 144 are patterned and etched to expose the second interconnect contact layer 136 and the terminals of the resistor arrays 138. A conductive material is then deposited over the substrate 102, followed by a CMP process to form a via contact 146a and a via contact 146b. Examples of the conductive material for the via contacts 146a, 146b may be a compound including tungsten or copper (Cu).

Next, a first level of metallization may be formed by a back-end-of-line (BEOL) process. In particular, as shown in FIGS. 6-13 and 7-13, an inter-level dielectric (ILD) layer 152 and a passivation layer 154 are formed over the substrate 102 via deposition. The ILD layer 152 may include any conventional organic (e.g., polyimide, polyamide, silicon-containing polymers) or inorganic dielectric material (e.g., boron phosphorus doped silicate glass (BPSG) or SiO2) that is may be employed in any interconnect structures. The ILD layer 152 may be formed using any known deposition process, including but not limited to CVD, PECVD, chemical solution deposition, spin-on coating, evaporation, and the like. The passivation layer 154 may include an insulating material such as an oxide, nitride, oxynitride, or any combination thereof. In one embodiment, the passivation layer 154 includes nitride (N). A patterned photoresist layer 159 is provided over the passivation layer 154 to define contact openings for the first level of metallization 156.

Next, as shown in FIGS. 6-14 and 7-14, an etching process may be performed to remove the exposed portion of the passivation layer 154 and the dielectric layer 152 in which the contact openings for the first level of metallization 156 are to be formed. As shown in FIGS. 6-14 and 7-14, a conductive material is deposited over the substrate 102, followed by CMP to fill the contact openings and form the first level of metallization 156. The conductive material may be formed via a deposition process such as sputtering, plating, CVD, PECVD, evaporation, and the like. The conductive material suitable for the first level of metallization 156 may include any conductive wiring material that may be used in any interconnect structure. Examples for the conductive material for the first level of metallization 156 include but not limited to: copper (Cu), aluminum (Al), tantalum (Ta), tantalum nitride (TaN), tungsten (W) or alloys and silicides thereof. The first level of metallization 156 is provided above the via contact 146a (and similarly above the via contact 146b, not shown) to form ports to connect between active devices in the integrated circuit structure 100 as well as to connect to the resistor array 138 via the via contacts 146a, 146b.

In the above embodiments, the resistor array 138 is described as being formed from the second interconnect contact layer 136. In other embodiments, the resistor array 138 over the STI region 106 may be formed with the first interconnect contact layer 126. In such embodiments, the first contact layer 126 is used to form a plurality of resistors in the resistor array 138 over the STI region 106. In such embodiments, the patterned photoresist 129 of FIGS. 6-6 and 7-6 may define the resistor array 138 to be formed with the first interconnect contact layer 126 over the STI region 106. Once defined, the conductive material for the first interconnect contact layer 126 is deposited to form the resistors in the resistor array 138 with the first interconnect contact layer 126. In further embodiments, the plurality of resistors in the resistor array 138 may be formed with the first interconnect contact layer 126 as well as the second interconnect contact layer 136.

FIG. 8 is a flow chart illustrating a process 600 for fabricating a resistor array in an integrated circuit structure. The process starts with forming a STI region in a substrate at item 602. The STI region may be formed by a lithographic process to define active regions and the STI region, an etching process to remove portions of the substrate in which the STI region is to be formed, and a deposition process to deposit a trench dielectric material, followed by an etch back process.

Next, gate regions over the active and dummy regions of the integrated circuit structure are formed (item 604). A standard gate formation process may be used to form gate region 112 over the active regions and dummy regions next to the STI region of the substrate 102.

Next, a first interconnect contact layer over the active and dummy regions is formed (item 606). The first interconnect contact layer may be formed by a lithographic process to define a first interconnect contact layer, an etching process to remove portions in which the first interconnect contact layer is to be formed, and a deposition process to deposit a conductive material, followed by a CMP process. In some embodiments, the first interconnect contact layer is formed in the same dielectric layer where the gate regions are formed.

Next, a second interconnect contact layer having a portion over the gate conductive region and another portion forming the resistors in the resistor array over the STI region are formed (item 608). The second interconnect contact layer may be formed by a lithographic process to define the portion over the gate conductive region, and the portion for the resistor array, an etching process to remove these portions, and a deposition process to deposit a conductive material into the removed portions, followed by a CMP process.

Next, via contacts over the second interconnect contact layer are formed at two opposite ends (terminals) of the resistor array (item 610). The via contacts and the resistor array may be formed by a lithographic process to define the via contacts, an etching process to remove portions in which the via contacts are to be formed, and a deposition process to deposit a conductive material to form the via contacts at opposite ends of the resistor array, followed by a CMP process.

Next, a first level of metallization over the via contacts at opposite ends of the resistor array is formed (item 612). The first level of metallization may be formed by a back-end-of-line (BEOL) process.

In other embodiments, the resistor array is formed with the first interconnect contact layer at item 606 instead of being formed with the second interconnect contact layer at item 608. In further embodiments, the resistor array may be formed with the first interconnect contact layer at item 606, as well as being formed with the second interconnect contact layer at item 608.

Embodiments of the present disclosure provide a plurality of resistors in a resistor array 138 made from one or more interconnect contact layer(s) during a MEOL process. By utilizing the interconnect contact layer(s) to form the resistor array 138, several advantages may be achieved. First, the interconnect contact layer(s) may be already a part of the circuit design with or without the resistor array 138. Accordingly, implementing the resistor array 138 using the interconnect contact layer(s) does not require an addition of another layer. Also, the resistor array 138 may be fabricated using standard semiconductor technology without additional mask or processing steps. Additionally, a resistor array 138 made from the interconnect contact layer(s) (e.g., tungsten) may have lower sheet resistance (e.g., about 100 ohm/sq or less) comparing to the resistance value of the Hi-R resistor of FIG. 1 (which may be about 650 ohm/sq). In some cases, the resistance value for a resistor array 138 made from the first interconnect layer 126 is about 17.6 ohm/sq, and the resistance value for a resistor array 138 made from the second interconnect layer 136 may be about 55 ohm/sq. The resistance value for a resistor array 138 made from the first interconnect layer 126 and the second interconnect layer 136 may be about 14 ohm/sq. Thus, the plurality of parallel resistors in the resistor array 138 may provide low sheet resistance (e.g., a high speed I/O terminating resistor), and may take much less space compared to the Hi-R resistor of FIG. 1. For example, the resistance for 6 parallel resistors in the resistor array 138 made from the second interconnect contact layer 136 may be about 118 ohms, and the resistance for the six parallel resistors in the resistor array 138 made from the first interconnect contact layer 126 may be about 38 ohms. In other examples, the resistance for the 6 parallel resistors may be different from the exemplary values mentioned above.

In some cases, the resistor array 138 made from one or more MEOL interconnect contact layer(s) may provide electromagnetic tolerance at least 5 times to 30 times higher than the Hi-R resistor of FIG. 1. In addition, the resistor array 138 according to the embodiments of the present disclosure provides very high noise immunity from the rest of the components in the integrated circuit structure. With respect to resistor tolerance, the resistor arrays 138 made from one or more MEOL interconnect contact layer(s) are about 30 percent. However, the percentage may be reduced by uniform layout of multiple resistor arrays 138 in an integrated circuit structure.

In the above embodiments, the resistors in the resistor array 138 have been described as being parallel. In other embodiments, the resistors in the resistor array 138 may not be parallel.

Also, in the above embodiments, the integrated circuit structure 100/500 has been described as having a resistor array 138. In other embodiments, the integrated circuit structure 100/500 may have a plurality of resistor arrays 138, with each of the resistor arrays 138 having the configuration like that shown in FIG. 3 or FIG. 5.

Although particular features have been shown and described, it will be understood that they are not intended to limit the claimed invention, and it will be made obvious to those skilled in the art that various changes and modifications may be made without departing from the spirit and scope of the claimed invention. The specification and drawings are, accordingly, to be regarded in an illustrative rather than restrictive sense. The claimed invention is intended to cover alternatives, modifications, and equivalents.

What is claimed is:

1. An integrated circuit structure, comprising:
   a semiconductor substrate;
   a shallow trench isolation (STI) region in the semiconductor substrate;
   one or more active devices formed on the semiconductor substrate;
   a first interconnect contact plane comprising a first interconnect contact layer that provides local interconnects to the one or more active devices;
   a second interconnect contact plane disposed on the first interconnect contact plane, the second interconnect contact plane comprising:
   a resistor array having a plurality of resistors disposed above the STI region, wherein the resistors are coupled in parallel to a first via and a second via disposed on respective ends of the plurality of resistors, wherein the first and second vias are in a via contact layer disposed on the second interconnect contact plane; and
   a second interconnect contact layer that contacts a plurality of local contacts in the first interconnect contact layer.

2. The integrated circuit structure of claim 1, wherein the first interconnect contact plane comprises gate regions for the one or more active devices.

3. The integrated circuit structure of claim 1, further comprising two dummy regions, wherein the STI region is located between the two dummy regions.

4. The integrated circuit structure of claim 1, wherein the resistor array has a sheet resistance of about 100 ohm/sq or less.

5. The integrated circuit structure of claim 1, wherein the resistor array is made of tungsten or tantalum.

6. The integrated circuit structure of claim 1, wherein at least one resistor in the resistor array has a length that is anywhere from 0.1 μm to 3 μm, and a width that is anywhere from 0.01 μm to 0.1 μm.

7. The integrated circuit structure of claim 1, wherein the resistor array has at least five resistors.

8. The integrated circuit structure of claim 1, wherein the first interconnect contact plane is for implementing gate regions of the one or more active devices, and wherein the first interconnect contact plane does not include the resistor array.

9. The integrated circuit structure of claim 1, wherein at least two of the resistors have a same length.

10. The integrated circuit structure of claim 1, wherein at least one of the resistors has an elongated configuration.

11. The integrated circuit structure of claim 1, wherein the resistor array comprises a first resistor and a second resistor that are coupled to different vias in the via contact layer, the first resistor having a longitudinal axis, wherein the first and second resistors are offset relative to each other in a direction that is along the longitudinal axis of the first resistor.

12. The integrated circuit structure of claim 1, further comprising an additional STI region, and an additional resistor array disposed above the additional STI region.

13. The integrated circuit structure of claim 12, wherein the resistor array and the additional resistor array have a same configuration.

14. The integrated circuit structure of claim 1, further comprising a level of metallization disposed above the via contact layer and contacts the first and second vias.

15. The integrated circuit structure of claim 1, wherein at least one of the local interconnects electrically couples to one of a source region and a drain region of one of the one or more active devices.

* * * * *